(12) United States Patent
Miyake (10) Patent No.: US 8,564,173 B2
(45) Date of Patent: Oct. 22, 2013

(54) ELASTIC WAVE DEVICE

(71) Applicant: Murata Manufacturing Co., Ltd., Nagaokakyo (JP)

(72) Inventor: Takashi Miyake, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/665,973

(22) Filed: Nov. 1, 2012

(65) Prior Publication Data

US 2013/0057113 A1 Mar. 7, 2013

Related U.S. Application Data

(63) Continuation of application No. PCT/JP2011/056938, filed on Mar. 23, 2011.

(30) Foreign Application Priority Data

May 26, 2010 (JP) ................................. 2010-120243

(51) Int. Cl.
*H01L 41/08* (2006.01)

(52) U.S. Cl.
USPC ...................................................... 310/313 R

(58) Field of Classification Search
USPC ................................................. 310/334, 336
See application file for complete search history.

(56) References Cited

U.S. PATENT DOCUMENTS

| | | | |
|---|---|---|---|
| 4,339,821 A * | 7/1982 | Coppock et al. ................. 372/18 |
| 4,636,678 A * | 1/1987 | Ballato ...................... 310/313 R |
| 4,691,714 A * | 9/1987 | Wong et al. .................... 600/551 |
| 5,359,250 A * | 10/1994 | Toda .......................... 310/313 R |
| 7,262,542 B2 * | 8/2007 | Toda .......................... 310/313 B |
| 8,035,464 B1 * | 10/2011 | Abbott et al. ................. 333/193 |

FOREIGN PATENT DOCUMENTS

| | | |
|---|---|---|
| JP | 04-281611 A | 10/1992 |
| JP | 11-088109 A | 3/1999 |
| JP | 2002-330047 A | 11/2002 |
| JP | 2003-008396 A | 1/2003 |
| JP | 2007-228011 A | 9/2007 |
| JP | 2008-211277 A | 9/2008 |
| JP | 2008-219720 A | 9/2008 |

OTHER PUBLICATIONS

Official Communication issued in International Patent Application No. PCT/JP2011/056938, mailed on May 31, 2011.

* cited by examiner

*Primary Examiner* — Mark Budd
(74) *Attorney, Agent, or Firm* — Keating & Bennett, LLP (57) ABSTRACT

In an elastic wave device that significantly reduces and prevents deterioration of a frequency characteristic without roughening an undersurface of a piezoelectric substrate, a structure is bonded to a surface of a piezoelectric substrate other than a main surface of the piezoelectric substrate on which IDTs are located. The structure is provided so that a path difference is defined between a first component and a second component of a bulk wave that is excited by the IDT and propagates in the piezoelectric substrate toward the bonding surface. The first component of the bulk wave is reflected from the bonding surface. The second component of the bulk wave enters the structure from the bonding surface, propagates in the structure, enters the piezoelectric substrate from the bonding surface, and propagates in the same direction as that of the first component reflected from the bonding surface in the piezoelectric substrate.

19 Claims, 5 Drawing Sheets

ELASTIC WAVE DEVICE

BACKGROUND OF THE INVENTION

1. Field of the Invention

The present invention relates to elastic wave devices, and, more particularly, to an elastic wave device that uses a surface acoustic wave or a boundary acoustic wave propagating on a piezoelectric substrate.

2. Description of the Related Art

An elastic wave device excites a surface acoustic wave or a boundary acoustic wave using a comb-shaped electrode (Interdigital Transducer (IDT)) formed on a piezoelectric substrate having piezoelectricity. At that time, a bulk wave that includes unnecessary oscillations generated at the IDT may be reflected from the undersurface of the piezoelectric substrate, be returned to the surface of the piezoelectric substrate, and be received by the IDT. In this case, a ripple is generated in a frequency characteristic.

In order to prevent such an occurrence, a method of roughening the undersurface of a piezoelectric substrate is known.

Figure 8:
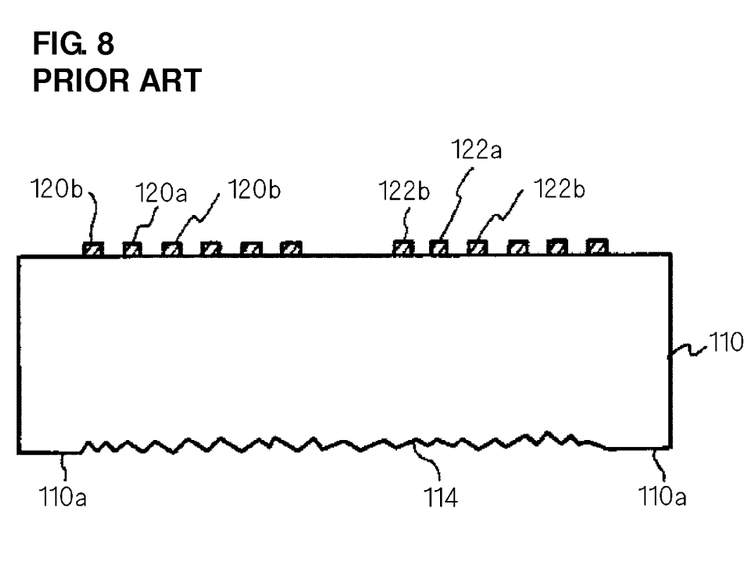
FIG. 8 is a cross-sectional view of a surface acoustic wave filter according to the related art.

For example, as illustrated in a cross-sectional view in FIG. 8, in a surface acoustic wave filter in which input-side electrodes 120a and 120b and output-side electrodes 122a and 122b are formed on the surface of a piezoelectric substrate 110, a rough surface area 114 is provided inside a margin frame 110a of an outer periphery of an undersurface of the piezoelectric substrate 110. As a result, a bulk wave is irregularly reflected in the area 114 on the undersurface, and it is possible to suppress reaching of the bulk wave to the output-side electrodes 122a and 122b. This suppresses the deterioration of a frequency characteristic. See, for example, Japanese Unexamined Patent Application Publication No. 2003-8396.

Unless the undersurface of a piezoelectric substrate is roughened, a ripple that is impermissible will be generated in a filter characteristic. However, when the undersurface of a piezoelectric substrate is roughened, the piezoelectric substrate is easily cracked from a microcrack on the undersurface of the piezoelectric substrate. This leads to the deterioration of a flexural strength. When a piezoelectric substrate is reduced in thickness to miniaturize an elastic wave device, the deterioration of a frequency characteristic caused by a bulk wave is increased. Furthermore, the thinner a piezoelectric substrate, the easier it cracks. Accordingly, it is difficult to suppress the deterioration of a frequency characteristic by roughening the undersurface of a piezoelectric substrate.

SUMMARY OF THE INVENTION

Preferred embodiments of the present invention provide an elastic wave device that significantly reduces and prevents deterioration of a frequency characteristic without roughening an undersurface of a piezoelectric substrate.

An elastic wave device according to a preferred embodiment of the present invention includes a piezoelectric substrate including a main surface on which an IDT is located and an elastic wave excited by the IDT propagates, and a structure bonded to a bonding surface that is one of the surfaces of the piezoelectric substrate other than the main surface. The structure is constructed such that a path difference is defined between a first component and a second component of a bulk wave that is excited by the IDT and propagates in the piezoelectric substrate toward the bonding surface, the first component being reflected from the bonding surface, the second component entering the structure from the bonding surface, propagating in the structure, and entering the piezoelectric substrate from the bonding surface, the first and second components propagating in the same direction in the piezoelectric substrate.

Using the above-described configuration, the first component of the bulk wave having an adverse effect on a device characteristic is reflected from the bonding surface of the piezoelectric substrate to which the structure is bonded, the second component of the bulk wave passes through the bonding surface, propagates in the structure, and enters the piezoelectric substrate from the bonding surface, and the first and second components propagate in the same direction in the piezoelectric substrate and cancel each other because of the phase difference between them. As a result, the adverse effect on a device characteristic is significantly reduced and prevented. At that time, it is unnecessary to roughen the other main surface (undersurface) opposing the main surface (surface) of the piezoelectric substrate on which the IDT is located. Accordingly, it is possible to significantly reduce and prevent the deterioration of a frequency characteristic without roughening the other main surface (undersurface) of the piezoelectric substrate.

Preferably, the structure is bonded to the other main surface of the piezoelectric substrate opposing the main surface.

In this case, the structure eliminates the bulk wave reflected from the other main surface of the piezoelectric substrate.

Preferably, the structure is bonded to a side surface of the piezoelectric substrate that is present between an outer periphery of the main surface and an outer periphery of the other main surface opposing the main surface.

In this case, the structure can eliminate the bulk wave reflected from the side surface of the piezoelectric substrate.

Preferably, under the assumption that an absolute value of the path difference between the first and second components of the bulk wave defined by the structure is d, a wavelength of the bulk wave is λ, and n is a positive integer other than zero, the following equation is preferably satisfied.

$$d \neq n\lambda \quad (1)$$

In this case, since there is a phase shift between the first and second components of the bulk wave, the structure can cause the first and second components of the bulk wave to cancel each other. Accordingly, the effect of the bulk wave can be more effectively weakened as compared with a case in which there no such structure is provided.

Preferably, under the assumption that an absolute value of the path difference between the first and second components of the bulk wave defined by the structure is d, a wavelength of the bulk wave is λ, and n is an integer equal to or larger than zero, the following equation is preferably satisfied.

$$(n+\tfrac{1}{4})\lambda < d < (n+\tfrac{3}{4})\lambda \quad (2)$$

In this case, since the first and second components of the bulk wave overlap in opposite phases in half the wavelength or larger and cancel each other, the effect of the bulk wave can be significantly reduced and prevented.

Preferably, under the assumption that an absolute value of the path difference between the first and second components of the bulk wave defined by the structure is d, a wavelength of the bulk wave is λ, and n is an integer equal to or larger than zero, the following equation is preferably satisfied.

$$d = (n+\tfrac{1}{2})\lambda \quad (3)$$

In this case, a phase condition in which the first and second components of the bulk wave weaken each other to the minimum degree is obtained, and the effect of the bulk wave is most effectively reduced and prevented.

Preferably, an amplitude of the first component of the bulk wave obtained when the first component is reflected from the bonding surface and an amplitude of the second component of the bulk wave obtained when the second component enters the piezoelectric substrate from the bonding surface are practically the same.

In this case, since the first and second components of the bulk wave practically have the same amplitude, the first and second components cancel each other and the effect of the destructive interference between bulk waves is increased.

Preferably, the structure includes a path difference defining film that is located on the bonding surface of the piezoelectric substrate and includes at least one layer.

In this case, since the path difference defining film can be formed in a simple process, a path difference can be formed in a simple process.

Preferably, the path difference defining film is an insulator.

In this case, no capacitance is provided between the IDT and the ground via the piezoelectric substrate.

Preferably, the path difference defining film is made of a conductive material.

In this case, the path difference defining film also preferably functions as a shield to block the effects of an electromagnetic field.

Preferably, the path difference defining film and the piezoelectric substrate are made of acoustically different materials.

When the path difference defining film and the piezoelectric substrate are made of materials with different densities and different hardnesses affecting a velocity of propagation of oscillations, the bulk wave can be reflected from the bonding surface.

Preferably, an acoustic impedance of the path difference defining film is different from that of the piezoelectric substrate.

In this case, the bulk wave propagating in the piezoelectric substrate has both a component reflected at the interface between the piezoelectric substrate and the path difference defining film and a component entering the path difference defining film from the interface.

Preferably, the following equation is practically satisfied where $Z1$ represents the acoustic impedance of the piezoelectric substrate and $Z2$ represents the acoustic impedance of the path difference defining film.

$$Z1/Z2 = 1/3 \quad (4)$$

In this case, half of the bulk wave propagating in the piezoelectric substrate is practically reflected from the interface between the path difference defining film and the piezoelectric substrate and the other half of the bulk wave practically enters the path difference defining film from the interface. It is therefore possible to effectively reduce the effects of the bulk wave.

Preferably, the following equation is practically satisfied where $Z1$ represents the acoustic impedance of the piezoelectric substrate and $Z2$ represents the acoustic impedance of the path difference defining film.

$$Z1/Z2 = 3 \quad (5)$$

In this case, half of the bulk wave propagating in the piezoelectric substrate is practically reflected from the interface between the path difference defining film and the piezoelectric substrate and the other half of the bulk wave practically enters the path difference defining film from the interface. It is therefore possible to effectively reduce and prevent the effects of the bulk wave.

Preferably, the path difference defining film is provided on only a portion of the other main surface of the piezoelectric substrate opposing the main surface or on only a portion of the side surface of the piezoelectric substrate that is present between the outer periphery of the main surface and the outer periphery of the other main surface opposing the main surface.

In this case, on the other main surface or the side surface of the piezoelectric substrate, a step is provided between an area in which the path difference defining film is provided and an area in which the path difference defining film is not provided. The path difference defining film can be formed at a necessary position in a simple process.

Preferably, the path difference defining film is provided at a position at which a bulk wave having an adverse effect on a device characteristic is reflected and in an area near the position on the other main surface and/or the side surface of the piezoelectric substrate.

In this case, the effects of the bulk wave having an adverse effect on a device characteristic are significantly reduced and prevented.

Preferably, on the other main surface and/or the side surface of the piezoelectric substrate, an area in which the path difference defining film is provided and an area in which the path difference defining film is not provided are alternately arranged.

When the bulk wave having an adverse effect on a device characteristic is reflected at many positions, in order to weaken the bulk wave, many steps are preferably provided in a wide area on the other main surface and/or the side surface of the piezoelectric substrate by providing many path difference defining films spaced apart from one another at the positions at which the bulk wave is reflected and in an area near such positions.

According to various preferred embodiments of the present invention, it is possible to significantly reduce and prevent the deterioration of a frequency characteristic without roughening the undersurface of a piezoelectric substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to FIGS. 1 to 7.

First Preferred Embodiment

An elastic wave device 10 according to a first preferred embodiment of the present invention will be described with reference to FIGS. 1 to 3.

Figure 1:
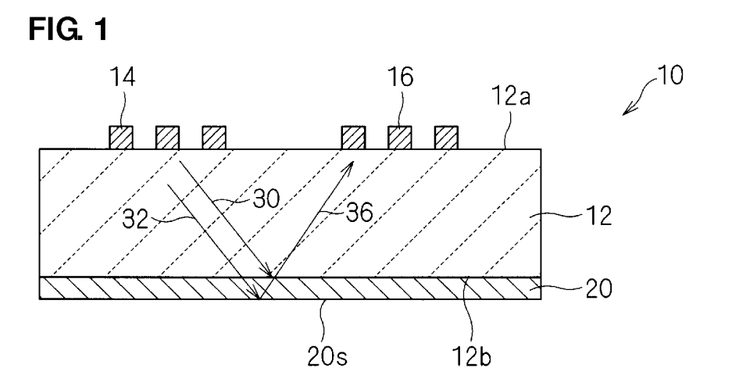
FIG. 1 is a cross-sectional view of an elastic wave according to a first preferred embodiment of the present invention.

FIG. 1 is a cross-sectional view of the elastic wave device 10 according to the first preferred embodiment. FIG. 2 is an enlarged cross-sectional view of a main portion of the elastic wave device illustrated in FIG. 1.

As illustrated in FIG. 1, in the elastic wave device 10 according to the first preferred embodiment, input-side IDTs 14 and output-side IDTs 16 are located on a surface 12a that is one of the main surfaces of a piezoelectric substrate 12. A path difference defining film 20, which is a structure, is fixed to an undersurface 12b that is the other one of the main surfaces of the piezoelectric substrate 12. The undersurface 12b of the piezoelectric substrate 12 is a bonding surface between the piezoelectric substrate 12 and the path difference defining film 20.

The path difference defining film 20 includes at least one layer. One of main surfaces of the path difference defining film 20 is bonded to the undersurface 12b of the piezoelectric substrate 12. The other one (reflection surface) 20s of the main surfaces of the path difference defining film 20 is externally exposed.

The piezoelectric substrate 12 and the path difference defining film 20 are preferably made of acoustically different materials. The piezoelectric substrate 12 and the path difference defining film 20 are arranged so that the acoustic impedances of them differ from each other and a reflectivity at the bonding surface (the undersurface 12b of the piezoelectric substrate 12) between them is not zero.

In the elastic wave device 10, a surface acoustic wave excited by the input-side IDT 14 propagates to the output-side IDT 16 along the surface 12a of the piezoelectric substrate 12. At that time, as illustrated in FIGS. 1 and 2, a bulk wave, which includes unnecessary oscillations, is excited by the input-side IDT 14 and propagates in the piezoelectric substrate 12 toward the undersurface 12b as represented by arrows 30 and 32.

A first component represented by the arrow 30 of the bulk wave is reflected from the undersurface 12b. A second component represented by the arrow 32 of the bulk wave passes through the undersurface 12b that is the bonding surface between the path difference defining film 20 and the piezoelectric substrate 12, enters the path difference defining film 20, is reflected from the reflection surface 20s of the path difference defining film 20, and then enters the piezoelectric substrate 12 from the undersurface 12b of the piezoelectric substrate 12. Subsequently, the second component propagates in the same direction as that of the first component reflected from the undersurface 12b in the piezoelectric substrate 12 while overlapping the first component as represented by an arrow 36.

Figure 2:
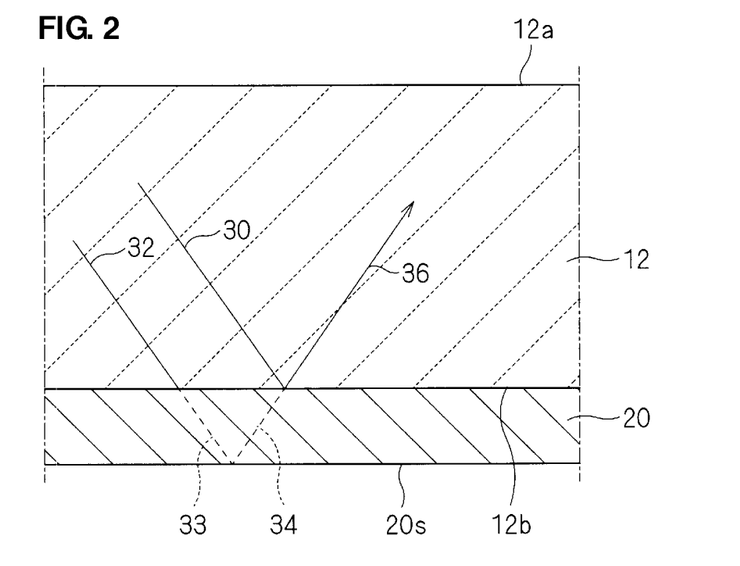
FIG. 2 is an enlarged cross-sectional view of a main portion of the elastic wave device according to the first preferred embodiment of the present invention.
Figure 3:
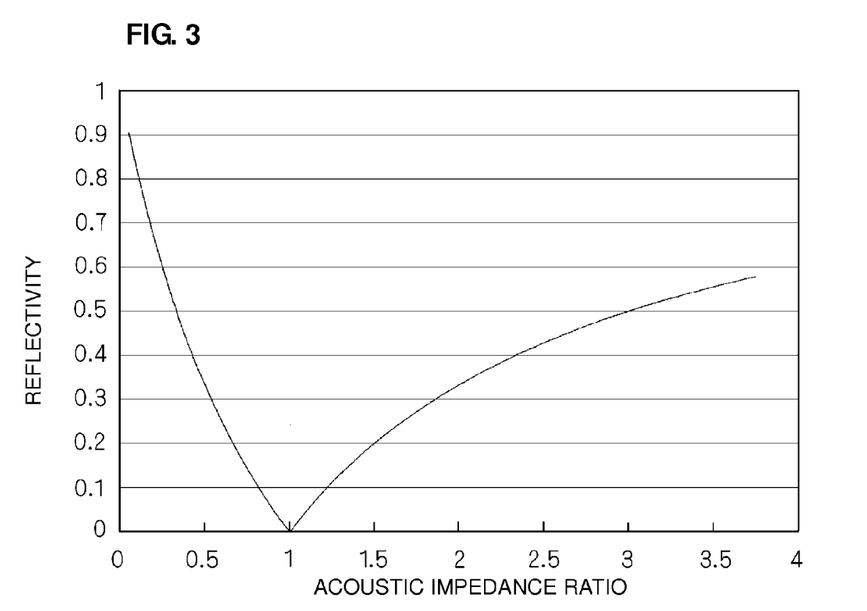
FIG. 3 is a graph illustrating the relationship between an acoustic impedance ratio and a reflectivity (analysis sample).

Since the second component represented by the arrow 32 propagates in the path difference defining film 20 along paths 33 and 34 represented by a broken line in FIG. 2, a path difference is defined between the first and second components. The path difference may be achieved by bonding a structure other than the path difference defining film 20 to the undersurface 12b of the piezoelectric substrate 12.

When there is a phase difference between the first and second components that propagate in the same direction while overlapping each other as represented by the arrow 36, they cancel each other because of the phase difference and the bulk wave is weakened before reaching the output-side IDT 16. Furthermore, since the second component propagates in a path longer than that for the first component, the amount of attenuation of the second component is larger than that of the first component. Accordingly, the bulk wave is weakened before reaching the output-side IDT 16.

As a result, it is possible to significantly reduce the adverse effects of a bulk wave on a device characteristic, and significantly reduce and prevent the deterioration of a frequency characteristic. In particular, when the piezoelectric substrate is thin, the adverse effects of the bulk wave on a device characteristic are large and the effect of significantly reducing and preventing the deterioration of a frequency characteristic is enhanced. More specifically, when the piezoelectric substrate 12 is a lithium tantalate substrate or a lithium niobate substrate and has a thickness of about 150 μm or less, for example, the effect of significantly reducing and preventing the deterioration of a frequency characteristic is enhanced.

Thus, it is unnecessary to roughen the undersurface 12b of the piezoelectric substrate 12 in case the path difference is provided. On the contrary, in order to cause the first and second components of the bulk wave to propagate while overlapping each other, it is desired that the undersurface 12b of the piezoelectric substrate 12 and the reflection surface 20s of the path difference defining film 20 be smooth and the first and second components be subjected to specular reflection. For example, the arithmetic average roughness of the undersurface 12b of the piezoelectric substrate 12 and the arithmetic average roughness of the reflection surface 20s of the path difference defining film 20 are preferably set to a value smaller than about 0.1 μm, and are preferably set to a value smaller than about 0.01 μm.

It is desired that the following equation be satisfied under the assumption that the path difference between the first and second components, that is, the total length of the paths 33 and 34 represented by the broken line in FIG. 2, is d, the wavelength of a bulk wave is λ, and n is a positive integer other than zero.

$$d \neq n\lambda \tag{1}$$

In this case, since a phase shift occurs between the first and second components of the bulk wave and the first and second components cancel each other, the effects of the bulk wave are significantly reduced and prevented.

It is desired that the following equation be satisfied under the assumption that the path difference between the first and second components, that is, the total length of the paths 33 and 34 represented by the broken line in FIG. 2, is d, the wavelength of a bulk wave is λ, and n is an integer equal to or larger than zero.

$$(n+1/4)\lambda < d < (n+3/4)\lambda \tag{2}$$

In this case, since the first and second components of the bulk wave overlap in opposite phases in half the wavelength or longer and cancel each other, the effects of the bulk wave are significantly reduced and prevented.

It is desired that the following equation be practically satisfied under the assumption that the path difference between the first and second components, that is, the total length of the paths 33 and 34 represented by the broken line in FIG. 2, is d, the wavelength of a bulk wave is λ, and n is an integer equal to or larger than zero.

$$d = (n+1/2)\lambda \tag{3}$$

In this case, a phase condition in which the first and second components of the bulk wave weaken each other to the minimum degree is obtained, and the effects of the bulk wave are significantly reduced and prevented.

The closer the amplitudes of the first and second components of the bulk wave, the larger the effect of mutual cancellation of the first and second components. When the first component reflected from the undersurface 12b of the piezoelectric substrate 12 and the second component that enters the path difference defining film 20 from the undersurface 12b of the piezoelectric substrate 12, is reflected from the reflection surface 20s of the path difference defining film 20, and then enters the piezoelectric substrate 12 from the undersurface 12b of the piezoelectric substrate 12 practically have the same amplitude, the first and second components cancel each other and the effects of the destructive interference between bulk waves are increased.

The path difference defining film 20 can be formed by various methods such as sputtering, vapor deposition, plating, lamination, printing, and application, for example. The path difference defining film 20 can form a path difference in a simple process.

When the path difference defining film 20 is made of an insulating material, no capacitance is provided between each of the IDTs 14 and 16 and the ground via the piezoelectric substrate 12 and a good isolation characteristic is obtained. On the other hand, when the path difference defining film 20 is made of a conductive material, the path difference defining film 20 can function as a shield against an electromagnetic field. One of an insulating material and a conductive material can be selected as a material for the path difference defining film 20 on the basis of a function required for the device.

Materials for the piezoelectric substrate 12 and the path difference defining film 20 are selected so that one of the following equations is practically satisfied where $Z1$ represents the acoustic impedance of the piezoelectric substrate 12 and $Z2$ represents the acoustic impedance of the path difference defining film 20.

$$Z1/Z2 = 1/3 \quad (4)$$

$$Z1/Z2 = 3 \quad (5)$$

That is, a reflectivity at an interface (the undersurface 12b of the piezoelectric substrate 12) between the piezoelectric substrate 12 and the path difference defining film 20 is $|Z1-Z2|/(Z1+Z2)$. The relationship between the acoustic impedance ratio of $Z1/Z2$ and the reflectivity of $|Z1-Z2|/(Z1+Z2)$ is illustrated in the graph in FIG. 3.

The condition under which the reflectivity is 0.5, that is, the half of an incident wave is reflected, is represented by the following equation.

$$|Z1-Z2|/(Z1+Z2) = 0.5 \quad (6)$$

The acoustic impedance ratio of $Z1/Z2$ at that time is one of the following values.

$$Z1/Z2 = 3 \quad (7)$$

$$Z1/Z2 = 1/3 \quad (8)$$

In consideration of attenuation in the path difference defining film 20, the deviation from this value occurs. A material completely satisfying equation (7) or (8) may not be present. Accordingly, materials for the piezoelectric substrate 12 and the path difference defining film 20 are selected so that acoustic impedances of the piezoelectric substrate 12 and the path difference defining film 20 practically satisfy equation (7) or (8).

The thickness of the path difference defining film 20 is changed in accordance with the wavelength of a bulk wave whose effect is expected to be reduced, a sound velocity and an incidence angle corresponding to the mode of the bulk wave, and materials for the piezoelectric substrate 12 and the path difference defining film 20.

Next, an exemplary method of determining a material for the path difference defining film 20 and the thickness of the path difference defining film 20 will be described.

When the elastic wave device 10 is an RF surface acoustic wave filter including a lithium tantalate substrate, which is preferably used in the case of a surface acoustic wave, as the piezoelectric substrate 12, $Z1$ is changed in accordance with the mode of a bulk wave and a cutting angle but is preferably in the range of about 2 to $5 \times 10^7$ (Ns/m³), for example. A material having an acoustic impedance close to three times or one-third $Z1$ is selected for the path difference defining film 20. Accordingly, in this case, good candidate materials for the path difference defining film 20 include silicon oxide having an acoustic impedance of approximately $1 \times 10^7$ (Ns/m³), aluminum having an acoustic impedance of approximately $2 \times 10^7$ (Ns/m³), platinum having an acoustic impedance of approximately $7 \times 10^7$ (Ns/m³), and tungsten having an acoustic impedance of approximately $1 \times 10^8$ (Ns/m³), for example.

When a silicon oxide thin film is used as the path difference defining film 20 and the effect of a bulk wave that is normally incident on the undersurface 12b of the piezoelectric substrate 12 and has a frequency of 1.6 GHz is reduced (the wavelength of the bulk wave propagating in silicon oxide is approximately 4 µm, for example), a path difference preferably is set to half of the wavelength, that is, the thickness of the path difference defining film 20 is set to quarter of the wavelength, for example. Accordingly, the thickness of the silicon oxide thin film becomes approximately 1 µm, for example.

Second Preferred Embodiment

An elastic wave device 10a according to the second preferred embodiment will be described with reference to FIG. 4.

Figure 4:
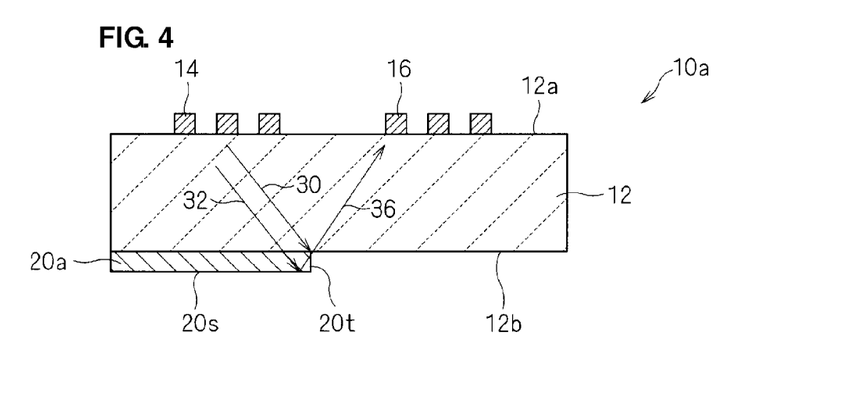
FIG. 4 is a cross-sectional view of an elastic wave device according to a second preferred embodiment of the present invention.

FIG. 4 is a cross-sectional view of the elastic wave device 10a according to the second preferred embodiment. As illustrated in FIG. 4, like in the first preferred embodiment, in the elastic wave device 10a according to the second preferred embodiment, the input-side IDTs 14 and the output-side IDTs 16 are located on the surface 12a of the piezoelectric substrate 12. A path difference defining film 20a is located on the undersurface 12b of the piezoelectric substrate 12.

The first component represented by the arrow 30 of a bulk wave that includes unnecessary oscillations excited by the input-side IDT 14 is reflected from the undersurface 12b of the piezoelectric substrate 12. The second component represented by the arrow 32 of the bulk wave passes through the undersurface 12b of the piezoelectric substrate 12, is reflected from the reflection surface 20s of the path difference defining film 20a, and then enters the piezoelectric substrate 12 from the undersurface 12b of the piezoelectric substrate 12. Subsequently, the first and second components propagate in the same direction while overlapping each other as represented by the arrow 36 and cancel each other, so that the bulk wave is weakened before reaching the output-side IDT 16. As a result, the deterioration of a frequency characteristic is significantly reduced and prevented.

The path difference defining film 20a differs from a path difference defining film according to the first preferred embodiment in that the path difference defining film 20a is provided on only a portion of the undersurface 12b of the piezoelectric substrate 12. Accordingly, on the undersurface 12b of the piezoelectric substrate 12, a step 20t is provided between an area in which the path difference defining film 20a is located and an area in which the path difference defining film 20a is not located.

For example, the step 20t of the path difference defining film 20a can be formed by forming a film on the whole of the undersurface 12b of the piezoelectric substrate 12, covering the area in which the path difference defining film 20a is to be formed by a resist, and removing an unnecessary portion of the film by dry etching or wet etching.

When the path difference defining film 20a is located at a position at which a bulk wave having an adverse effect on a device characteristic is reflected, it is possible to weaken the bulk wave, reduce the adverse effect on a device characteristic, and significantly reduce and prevent the deterioration of a frequency characteristic.

The path difference is determined in accordance with the height of the step 20t, that is, the thickness of the path difference defining film 20a. The height of the step 20t is set preferably using a method similar to the film thickness setting method described in the first preferred embodiment.

For example, the pattern of the path difference defining film 20a is designed so that the path difference defining film 20a is disposed at a position at which a bulk wave causing a problem in a characteristic is reflected or in an area near the position and substantially the same energy of the bulk wave is obtained when the bulk wave is reflected at the top and bottom of the step 20t (the undersurface 12b of the piezoelectric substrate 12 and the reflection surface 20s of the path difference defining film 20a).

When a bulk wave causing a problem in a characteristic is reflected at only one position, the step 20t is provided at only one position as illustrated in FIG. 4.

Third Preferred Embodiment

An elastic wave device 10b according to the third preferred embodiment will be described with reference to FIG. 5.

Figure 5:
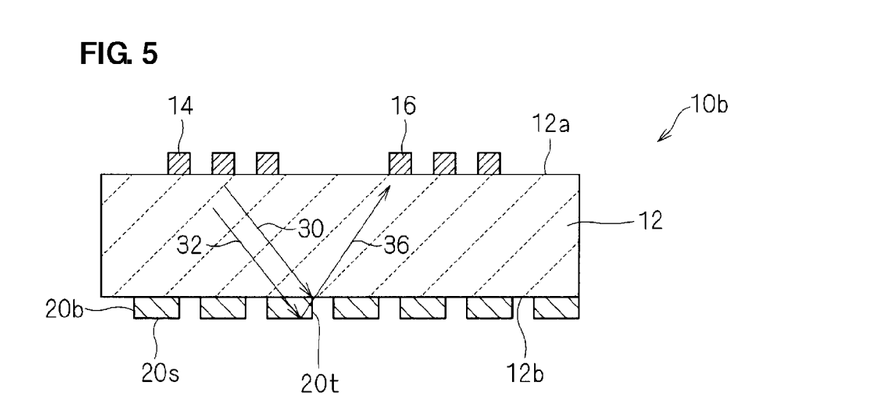
FIG. 5 is a cross-sectional view of an elastic wave device according to a third preferred embodiment of the present invention.

FIG. 5 is a cross-sectional view of the elastic wave device 10b according to the third preferred embodiment. As illustrated in FIG. 5, like in the first and second preferred embodiments, in the elastic wave device 10b according to the third preferred embodiment, the input-side IDTs 14 and the output-side IDTs 16 are provided on the surface 12a of the piezoelectric substrate 12. On the undersurface 12b of the piezoelectric substrate 12, a path difference defining film 20b is provided.

The first component represented by the arrow 30 of a bulk wave that includes unnecessary oscillations excited by the input-side IDT 14 is reflected from the undersurface 12b of the piezoelectric substrate 12. The second component represented by the arrow 32 of the bulk wave passes through the undersurface 12b of the piezoelectric substrate 12, is reflected from the reflection surface 20s of the path difference defining film 20b, and then enters the piezoelectric substrate 12 from the undersurface 12b of the piezoelectric substrate 12. Subsequently, the first and second components propagate in the same direction while overlapping each other as represented by the arrow 36 and cancel each other, so that the bulk wave is weakened before reaching the output-side IDT 16. As a result, the deterioration of a frequency characteristic is significantly reduced and prevented.

The path difference defining film 20b differs from path difference defining films according to the first and second preferred embodiments in that an area in which the path difference defining film 20b is provided and an area in which the path difference defining film 20 is not provided are alternately present and a plurality of steps 20t are arranged on the undersurface 12b of the piezoelectric substrate 12.

When the step 20t located at one position illustrated in FIG. 4 is insufficient for the reason that there are a plurality of bulk waves causing a problem in a characteristic, a plurality of steps 20t may preferably be provided as illustrated in FIG. 5. In this case, the pattern shape and density of the path difference defining film 20b are designed so that substantially the same energy of a bulk wave is obtained when the bulk wave is reflected at the top and bottom of the step 20t.

First Comparative Example

Figure 6:
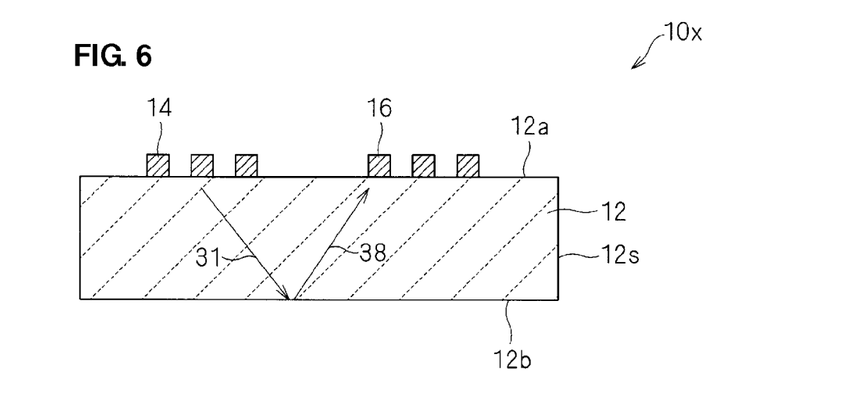
FIG. 6 is a cross-sectional view of an elastic wave device according to a first comparative example.

An elastic wave device 10x that is the first comparative example will be described with reference to FIG. 6.

In the elastic wave device 10x that is the first comparative example, the input-side IDTs 14 and the output-side IDTs 16 are provided on the surface 12a of the piezoelectric substrate 12. No structure is bonded to the undersurface 12b of the piezoelectric substrate 12.

As represented by arrows 31 and 38, a bulk wave excited by the input-side IDT 14 propagates in the piezoelectric substrate 12 toward the undersurface 12b, is reflected from the undersurface 12b, reaches the output-side IDT 16, and is received by the output-side IDT 16.

In contrast, by bonding the path difference defining film 20, 20a, or 20b to the undersurface 12b of the piezoelectric substrate 12 as described in the first to third preferred embodiments of the present invention, the bulk wave can be weakened before reaching the output-side IDT 16. As a result, the deterioration of a frequency characteristic is significantly reduced and prevented.

Second Comparative Example

Figure 7A:
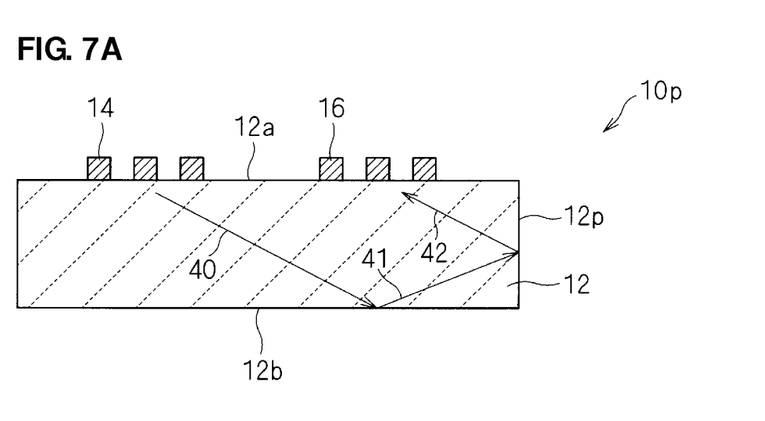
FIGS. 7A to 7C are cross-sectional views of an elastic wave device according to a second comparative example.
Figure 7B:
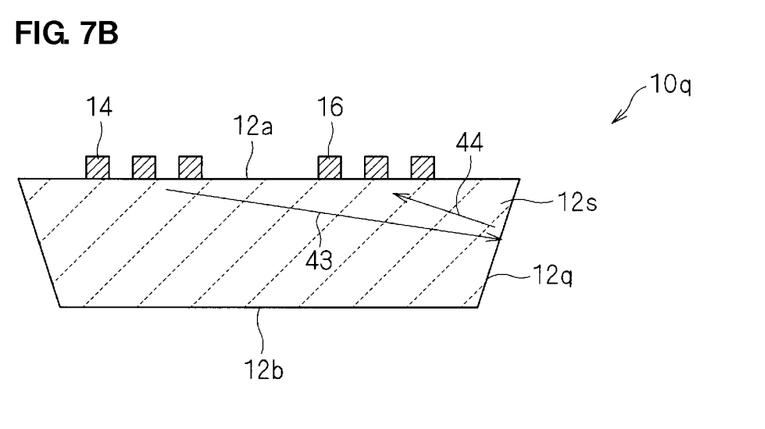
Figure 7C:
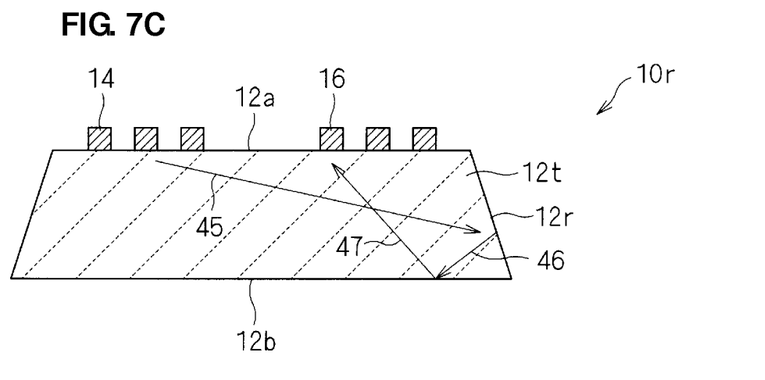

Elastic wave devices 10p to 10r that are the second comparative examples will be described with reference to FIGS. 7A to 7C.

In the elastic wave devices 10p to 10r that are the second comparative examples, on the surfaces 12a of the piezoelectric substrate 12 and piezoelectric substrates 12s and 12t, the input-side IDTs 14 and the output-side IDTs 16 are provided. No structure is bonded to the undersurfaces 12b of the piezoelectric substrates 12, 12s, and 12t.

As represented by arrows 40 to 47, a bulk wave excited by the input-side IDT 14 is reflected from the undersurface 12b and side surfaces 12p, 12q, and 12r of the piezoelectric substrates 12, 12s, and 12t between the outer peripheries of the surface 12a and the undersurface 12b, reaches the output-side IDT 16, and is received by the output-side IDT 16.

By bonding a structure for forming a path difference such as the path difference defining film 20, 20a, or 20b according to the first, second, or third preferred embodiment of the present invention to the side surfaces 12p to 12r at which a bulk wave is reflected, the bulk wave can be weakened before reading the output-side IDT 16. As a result, the deterioration of a frequency characteristic is significantly reduced and prevented.

By providing a structure to define a path difference at a position at which a bulk wave is reflected and in an area near the position, it is possible to significantly reduce and prevent the deterioration of a frequency characteristic without roughening the undersurface of a piezoelectric substrate.

The present invention is not limited to the above-described preferred embodiments, and various changes can be made thereto.

For example, a structure that defines a path difference is not limited to a path difference defining film, and may have various configurations.

The present invention is not limited to an elastic wave device using a surface acoustic wave, and can be applied to an elastic wave device using a boundary acoustic wave. By bonding a structure that defines a path difference at a position at which a bulk wave is reflected and in an area near the position, it is possible to significantly reduce and prevent the deterioration of a frequency characteristic without roughening the undersurface of a piezoelectric substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate including a main surface on which an IDT is located and an elastic wave excited by the IDT propagates; and
   a structure located on a bonding surface of the piezoelectric substrate other than the main surface; wherein
   the structure is arranged such that a path difference is defined between a first component and a second component of a bulk wave that is excited by the IDT and propagates in the piezoelectric substrate toward the bonding surface, the first component being reflected from the bonding surface, the second component entering the structure from the bonding surface, propagating in the structure, and entering the piezoelectric substrate from the bonding surface, the first and second components propagating in the same direction in the piezoelectric substrate; and
   the structure is bonded to a side surface of the piezoelectric substrate located between an outer periphery of the main surface and an outer periphery of the other main surface opposing the main surface.

2. The elastic wave device according to claim 1, wherein the structure is bonded to another main surface of the piezoelectric substrate opposing the main surface.

3. The elastic wave device according to claim 1, wherein $d \neq n\lambda$ is satisfied where an absolute value of the path difference between the first and second components of the bulk wave defined by the structure is d, a wavelength of the bulk wave is $\lambda$, and n is a positive integer.

4. The elastic wave device according to claim 1, wherein $(n+1/4)\lambda < d < (n+3/4)\lambda$ is satisfied where an absolute value of the path difference between the first and second components of the bulk wave defined by the structure is d, a wavelength of the bulk wave is $\lambda$, and n is an integer equal to or larger than zero.

5. The elastic wave device according to claim 1, wherein $d=(n+1/2)\lambda$ is satisfied where an absolute value of the path difference between the first and second components of the bulk wave defined by the structure is d, a wavelength of the bulk wave is $\lambda$, and n is a positive integer.

6. An elastic wave device comprising:
   a piezoelectric substrate including a main surface on which an IDT is located and an elastic wave excited by the IDT propagates; and
   a structure located on a bonding surface of the piezoelectric substrate other than the main surface; wherein
   the structure is arranged such that a path difference is defined between a first component and a second component of a bulk wave that is excited by the IDT and propagates in the piezoelectric substrate toward the bonding surface, the first component being reflected from the bonding surface, the second component entering the structure from the bonding surface, propagating in the structure, and entering the piezoelectric substrate from the bonding surface, the first and second components propagating in the same direction in the piezoelectric substrate; and
   an amplitude of the first component of the bulk wave obtained when the first component is reflected from the bonding surface and an amplitude of the second component of the bulk wave obtained when the second component enters the piezoelectric substrate from the bonding surface are the same or substantially the same.

7. The elastic wave device according to claim 1, wherein the structure is a path difference defining film that is located on the bonding surface of the piezoelectric substrate and includes at least one layer.

8. The elastic wave device according to claim 7, wherein the path difference defining film is an insulator.

9. The elastic wave device according to claim 7, wherein the path difference defining film is made of a conductive material.

10. The elastic wave device according to claim 7, wherein the path difference defining film and the piezoelectric substrate are made of acoustically different materials.

11. The elastic wave device according to claim 10, wherein an acoustic impedance of the path difference defining film is different from an acoustic impedance of the piezoelectric substrate.

12. An elastic wave device comprising:
    a piezoelectric substrate including a main surface on which an IDT is located and an elastic wave excited by the IDT propagates; and
    a structure located on a bonding surface of the piezoelectric substrate other than the main surface; wherein
    the structure is arranged such that a path difference is defined between a first component and a second component of a bulk wave that is excited by the IDT and propagates in the piezoelectric substrate toward the bonding surface, the first component being reflected from the bonding surface, the second component entering the structure from the bonding surface, propagating in the structure, and entering the piezoelectric substrate from the bonding surface, the first and second components propagating in the same direction in the piezoelectric substrate;
    the structure is a path difference defining film that is located on the bonding surface of the piezoelectric substrate and includes at least one layer;
    the path difference defining film and the piezoelectric substrate are made of acoustically different materials;
    an acoustic impedance of the path difference defining film is different from an acoustic impedance of the piezoelectric substrate; and
    $Z1/Z2=1/3$ is satisfied where Z1 represents acoustic impedance of the piezoelectric substrate and Z2 represents acoustic impedance of the path difference defining film.

13. An elastic wave device comprising:
    a piezoelectric substrate including a main surface on which an IDT is located and an elastic wave excited by the IDT propagates; and
    a structure located on a bonding surface of the piezoelectric substrate other than the main surface; wherein
    the structure is arranged such that a path difference is defined between a first component and a second component of a bulk wave that is excited by the IDT and propagates in the piezoelectric substrate toward the bonding surface, the first component being reflected from the bonding surface, the second component entering the structure from the bonding surface, propagating in the structure, and entering the piezoelectric substrate from the bonding surface, the first and second components propagating in the same direction in the piezoelectric substrate;

the structure is a path difference defining film that is located on the bonding surface of the piezoelectric substrate and includes at least one layer;

the path difference defining film and the piezoelectric substrate are made of acoustically different materials;

an acoustic impedance of the path difference defining film is different from an acoustic impedance of the piezoelectric substrate; and $Z1/Z2=3$ is satisfied where $Z1$ represents acoustic impedance of the piezoelectric substrate and $Z2$ represents acoustic impedance of the path difference defining film.

14. An elastic wave device comprising:

a piezoelectric substrate including a main surface on which an IDT is located and an elastic wave excited by the IDT propagates; and a structure located on a bonding surface of the piezoelectric substrate other than the main surface; wherein the structure is arranged such that a path difference is defined between a first component and a second component of a bulk wave that is excited by the IDT and propagates in the piezoelectric substrate toward the bonding surface, the first component being reflected from the bonding surface, the second component entering the structure from the bonding surface, propagating in the structure, and entering the piezoelectric substrate from the bonding surface, the first and second components propagating in the same direction in the piezoelectric substrate; and the path difference defining film is provided only a portion of the other main surface of the piezoelectric substrate opposing the main surface or on only a portion of a side surface of the piezoelectric substrate that is present between an outer periphery of the main surface and an outer periphery of the other main surface opposing the main surface.

15. The elastic wave device according to claim 14, wherein the path difference defining film is located at a position at which a bulk wave having an adverse effect on a device characteristic is reflected and in an area near the position on the other main surface and/or the side surface of the piezoelectric substrate.

16. The elastic wave device according to claim 15, wherein, on the other main surface and/or the side surface of the piezoelectric substrate, an area in which the path difference defining film is provided and an area in which the path difference defining film is not provided are alternately arranged.

17. An elastic wave device comprising:

a piezoelectric substrate including a main surface on which an IDT is located and an elastic wave excited by the IDT propagates; and a structure located on a bonding surface of the piezoelectric substrate other than the main surface; wherein the structure is arranged such that a path difference is defined between a first component and a second component of a bulk wave that is excited by the IDT and propagates in the piezoelectric substrate toward the bonding surface, the first component being reflected from the bonding surface, the second component entering the structure from the bonding surface, propagating in the structure, and entering the piezoelectric substrate from the bonding surface, the first and second components propagating in the same direction in the piezoelectric substrate;

the structure is a path difference defining film that is located on the bonding surface of the piezoelectric substrate and includes at least one layer; and the path difference defining film is made of one of a silicon oxide having an acoustic impedance of approximately $1\times10^7$ (Ns/m$^3$), an aluminum having an acoustic impedance of approximately $2\times10^7$ (Ns/m$^3$), a platinum having an acoustic impedance of approximately $7\times10^7$ (Ns/m$^3$), and a tungsten having an acoustic impedance of approximately $1\times10^8$ (Ns/m$^3$).

18. The elastic wave device according to claim 1, wherein an undersurface of the piezoelectric substrate does not include any roughened area.

19. The elastic wave device according to claim 1, wherein the elastic wave device is a surface acoustic wave device or a boundary acoustic wave device.

* * * * *